US 6,458,679 B1

(12) United States Patent
Paton et al.

(10) Patent No.: US 6,458,679 B1
(45) Date of Patent: Oct. 1, 2002

(54) METHOD OF MAKING SILICIDE STOP LAYER IN A DAMASCENE SEMICONDUCTOR STRUCTURE

(75) Inventors: Eric N. Paton, Morgan Hill, CA (US);
Paul R. Besser, Austin, TX (US);
Matthew S. Buynoski, Palo Alto, CA (US); Qi Xiang, San Jose, CA (US);
Paul L. King; John Clayton Foster, both of Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/780,454

(22) Filed: Feb. 12, 2001

(51) Int. Cl.[7] ............................................. H01L 21/3205
(52) U.S. Cl. ....................................... 438/592; 438/299
(58) Field of Search ................................. 438/229, 299, 438/664, 682–683, 592, FOR 193

(56) References Cited

U.S. PATENT DOCUMENTS 5,397,909 A * 3/1995 Moslehi
5,856,225 A * 1/1999 Lee et al.
6,140,688 A * 10/2000 Gardner et al.
6,316,323 B1 * 11/2001 Fang et al.

* cited by examiner

*Primary Examiner*—George Fourson
*Assistant Examiner*—Suk-San Foong

(57) ABSTRACT

A damascene gate semiconductor structure that is formed utilizing a silicide stop layer. Initially, a gate opening is provided in an insulating layer on a substrate. A first dielectric layer is deposited in the gate opening over the substrate. A silicide stop layer is then deposited in the gate opening over the first silicon layer. A second silicon layer is then deposited in the gate opening over the silicide stop layer. A metal or alloy layer is then deposited over the insulating and the second silicon layer. The damascene semiconductor structure is then temperature treated to react the metal or alloy layer with the second silicon layer to form a silicide layer. Any unreated metal or alloy is then removed from the metal or alloy layer.

9 Claims, 6 Drawing Sheets

METHOD OF MAKING SILICIDE STOP LAYER IN A DAMASCENE SEMICONDUCTOR STRUCTURE

FIELD OF THE INVENTION

The present invention relates to the formation of silicide in a damascene semiconductor structure. More particularly, the apparatus and method of the present invention allows for controlled silicidation of semiconductor material in a damascene semiconductor structure with the utilization of a silicide stop layer.

DESCRIPTION OF THE RELATED ART

Semiconductor damascene structures are well known in the semiconductor device industry. Typically, to form a damascene structure, a dielectric layer is deposited on a silicon substrate and regions are etched in the dielectric layer in a controlled manner. The etched regions may be trenches, vias, or other etched formations well-known in the art. Subsequent to the step of etching the dielectric layer, specifically chosen materials are deposited in a calculated and controlled manner in the etched regions. The deposition and formation of material layers in the trench is part of damascene semiconductor processing. Through adequate design and processing of a semiconductor structure, the semiconductor structure can operate as a semiconductor device. Examples of semiconductor devices include transistors, memory units, LEDs, and other well-known semiconductor devices.

Often one of the material layers formed in a damascene semiconductor structure is a silicide layer. The material of the silicide layer typically comprises the product of a metal or alloy reacted with a silicon material. It is often advantageous for a silicide to be formed in a semiconductor structure in a self-aligned manner. A self-aligned silicide has the advantage of being formed in a semiconductor structure without the need to selectively etch any of the silicide layer away to define the silicide regions. Silicides are often formed in damascene semiconductor structures to provide low resistivity regions for various reasons. Such reasons include the provision of interconnect structures between semiconductor devices, lowering the resistivity of a region of a semiconductor structure to enhance the operability of a semiconductor device, or other reasons that are well-known in the art.

FIGS. 1–8 exemplify the formation of silicide regions in a semiconductor damascene structure. FIG. 1 shows silicon substrate 10 with a gate 15 and spacers 11 formed thereon. The silicon substrate 10 may be N+ doped to form source/drain regions 13. FIG. 2 shows a dielectric layer 12 deposited on the silicon substrate 10 and surrounding the spacers 11. FIG. 3 shows the gate 15 etched to form an opening 14 down to the silicon substrate 10. FIG. 4 shows a dielectric layer 16 deposited in the opening 14 on the silicon substrate 10. FIG. 5 shows a silicon layer 18 deposited on dielectric layer 16 in the opening 14. FIG. 6 shows a metal layer 20 deposited on the dielectric layer 12 and on the silicon layer 18. FIG. 7 shows silicide layer 22 formed from the semiconductor structure shown in FIG. 6 by a heat treatment that reacts the silicon layer 18 with the metal layer 20 to form silicide layer 22 over dielectric layer 16. A layer of unreacted metal 21 from the metal layer 20 of FIG. 6 remains over the dielectric layer 12 and silicide layer 22. The unreacted metal layer 21 is typically stripped away from the semiconductor structure using conventional stripping techniques. FIG. 8 shows the semiconductor structure of FIG. 7 after the unreacted metal layer 21 has been stripped away. Depending on the type of silicide formed, additional heat treatment may be preformed to produce the lowest resistivity phase of the silicide.

The exemplary semiconductor structure of FIG. 8 is a characteristic structure of a metal-oxide semiconductor field-effect-transistor (MOSFET). The silicon substrate 10 may comprise a source and a drain. Further, dielectric layer 16 may serve as a gate dielectric and silicide region 20 may serve as a gate. Typically, during the silicidation of silicon layer 18, the entire silicon layer 18 is silicidized to form silicide layer 22. As a result, the silicide layer 22 is in contact with dielectric layer 16.

There are certain disadvantages to the prior art apparatus and method described above. Typically in semiconductor processing, silicon layer 18 is silicidized to form a silicide layer 22 and the entire silicon layer 18 is silicidized during a reaction with metal layer 20 during the heat treatment. This typically results in the direct contact of the silicide layer 22 with the dielectric layer 16. This has an undesirable effect on the work function. In an ideal MOSFET it is desirable for the gate, such as formed by silicide layer 22, and the semiconductor substrate with a source and drain, such as semiconductor substrate 10, to have the same work function.

The work function is the minimal energy needed to remove an electron from the fermi energy level ($E_F$) of a material to the vacuum energy level ($E_0$). The fermi energy level is the average energy of electrons in the material in the resting state. FIG. 9 exemplifies a band diagram of an ideal MOSFET, wherein region 23 represents a gate, region 25 represents a gate dielectric, and region 27 represents a semiconductor substrate. FIG. 9 is characterized as being an ideal MOSFET because the work function ($\phi_A$) 29 of region 23 and the work function ($\phi_B$) 31 of region 27 are substantially equivalent. This characteristic prevents the effect of a bias voltage between the gate and the semiconductor substrate. For a MOSFET to operate most efficiently and effectively, the work function of the gate and the work function of the semiconductor substrate should be approximately the same, preventing an effective bias voltage.

FIG. 10 exemplifies the band diagram of a non-ideal MOSFET, wherein region 35 represents a gate and region 33 represents a semiconductor substrate that are separated by the gate dielectric represented by region 37. The work function ($\phi_C$) 39 of region 35 and the work function ($\phi_D$) 41 of region 33 are not equal. An exemplary MOSFET with a band diagram of FIG. 10 has an effective bias voltage applied to the gate. Such a bias voltage can interfere with the operation of transistor having the general structure of FIG. 8. Transistors are, therefore, normally engineered such that the work function of the gate region and the work function of the semiconductor region are the same.

One disadvantage of the MOSFETs exemplified in FIG. 8 is that it is difficult to control the amount of silicidation of silicon layer 18 of FIG. 6 and thereby control the work function of the gate region 22 to match the work function of the semiconductor substrate 10. These differences in work functions result in an effective bias voltage applied to the gate of the MOSFET, which is undesirable.

SUMMARY OF THE INVENTION

There is a need for a semiconductor damascene structure in which a semiconductor layer can be silicidized in a controlled manner, to allow for the work function of the gate and the work function of the silicon substrate to be substantially equal.

These and other needs are met by embodiments of the present invention which provide a damascene semiconductor structure with a silicide stop layer which enables improved control of the silicidation of semiconductor material in a damascene semiconductor structure. A gate and spacers are formed over a semiconductor substrate. A dielectric layer is formed over the semiconductor substrate and around the spacers. The gate is etched to form an opening down to the semiconductor substrate. A first silicon layer is deposited in the opening over the semiconductor substrate. A silicide stop layer is then deposited in the opening over the first silicon layer. A second silicon layer is then deposited in the opening over the silicide stop layer. A metal layer or alloy layer is then deposited over the insulating layer and the second silicon layer and undergoes a temperature treatment. The temperature treatment causes the silicidation of the second silicon layer by reacting the metal layer or alloy with the second silicon layer. The unreacted metal or alloy layer of the metal layer or alloy layer is then stripped away and the semiconductor structure of the present invention is accomplished.

One of the advantages of the present invention is the controlled silicidation of semiconductor materials deposited in the trench by the utilization of a silicide stop layer. The silicide stop layer prevents silicidation of materials below the silicide stop layer by blocking the diffusion of metal from the metal layer. This feature allows, among other things, the tailoring of the work function of the gate and semiconductor substrate. This tailoring of the work function is a beneficial aspect to many types of semiconductor devices.

For example, a MOSFET can be in the form of a semiconductor damascene structure. An ideal MOSFET has a gate and semiconductor substrate with work functions that are substantially equal. Complete silicidation of the materials comprising the gate may inhibit the engineering of the work functions. The use of a silicide stop layer allows for the engineering of the work functions of a MOSFET to form an ideal MOSFET. This allows for such a MOSFET to operate most efficiently and effectively.

The foregoing and other features, aspects, and advantages of the present invention will become more apparent from the following detailed description of the present invention taken in conjunction with the accompanying drawings.

DETAILED DESCRIPTION OF THE INVENTION

The present invention addresses problems related to the use of damascene gates employing silicide or other metals as the gate electrode material. These problems, including change of work function, are solved in part by the provision of a silicide stop layer in the gate electrode that prevents the complete silicidation of the gate electrode. Since silicon remains in contact with the gate dielectric, even after silicidation of part of the gate electrode, the work function does not have to be re-engineered.

Figure 1:
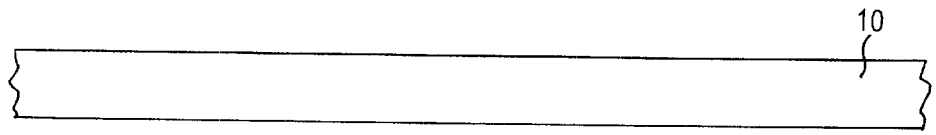
FIGS. 1–8 show the formation of a damascene gate in accordance with a prior art method.
Figure 2:
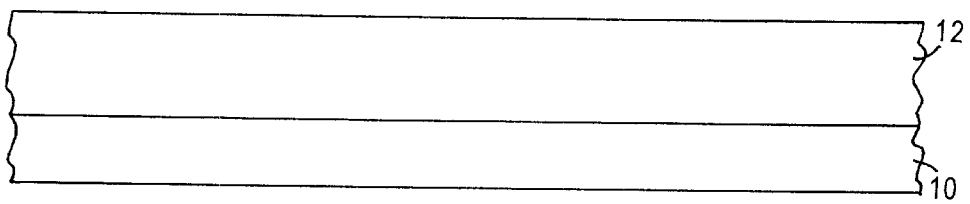
Figure 3:
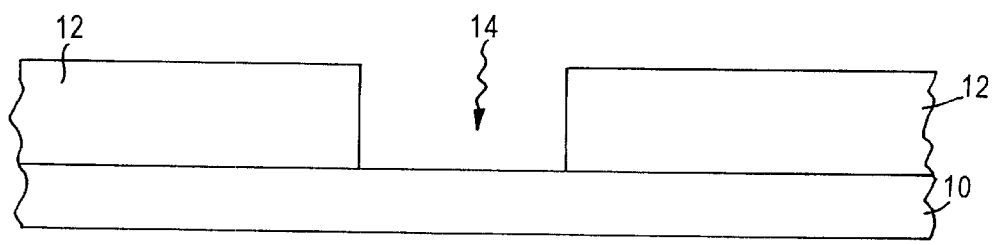
Figure 4:
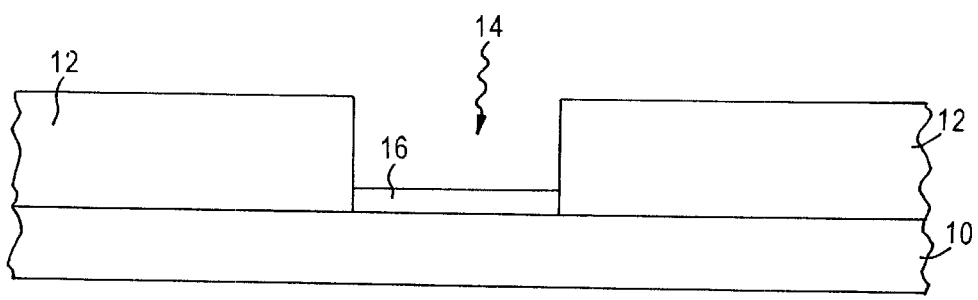
Figure 5:
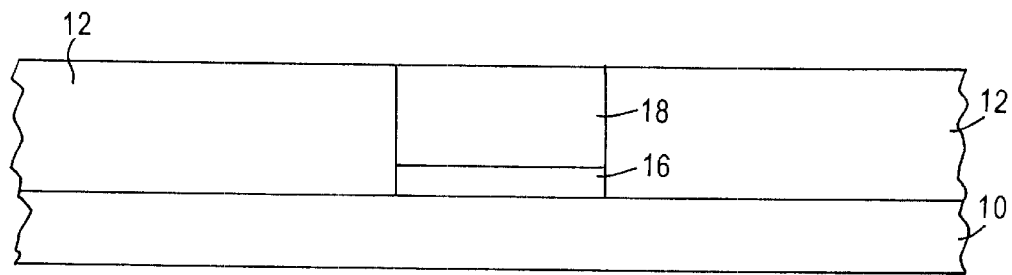
Figure 6:
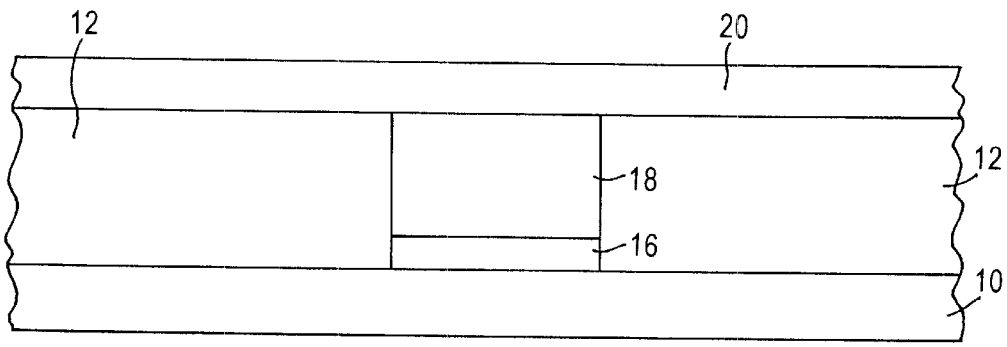
Figure 7:
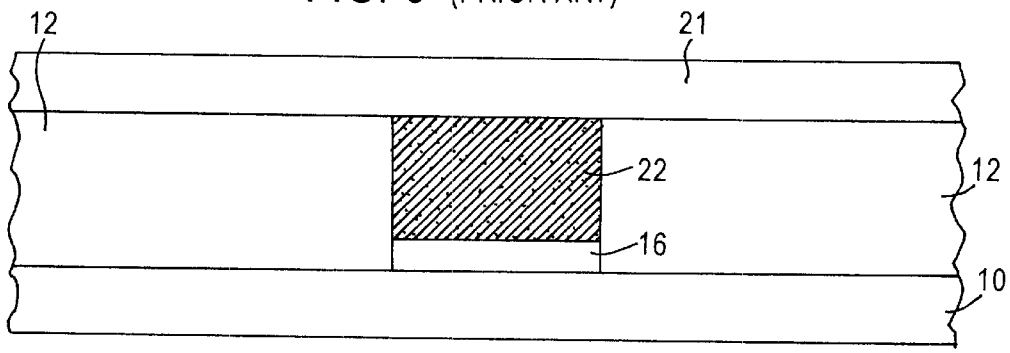
Figure 8:
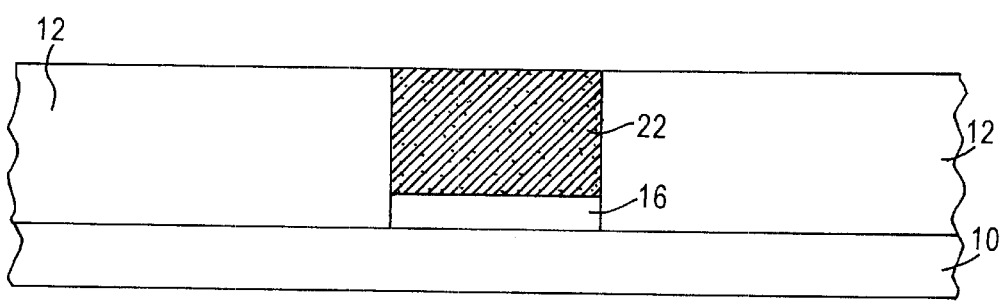
Figure 9:
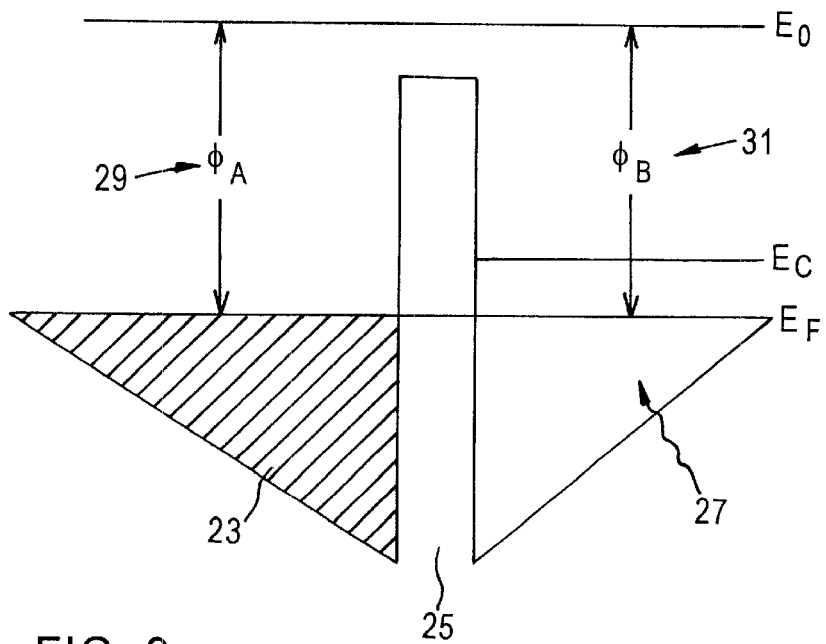
FIG. 9 is a prior art band diagram of an ideal MOSFET.
Figure 10:
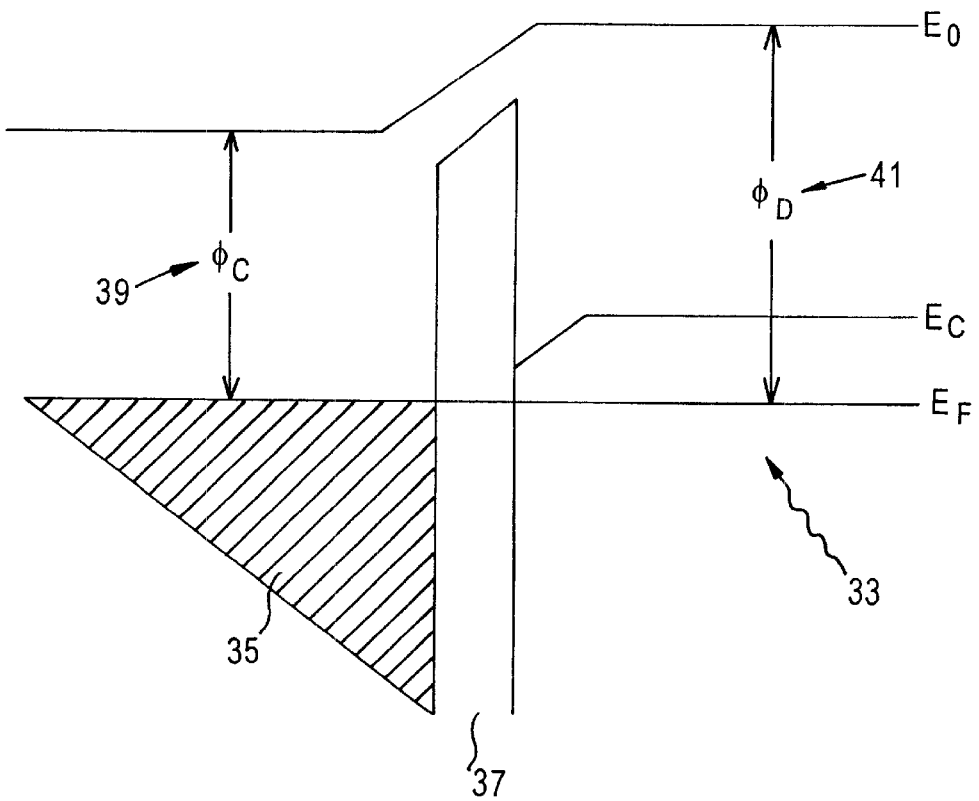
FIG. 10 is a prior art band diagram of a non-ideal MOSFET. 10
Figure 11:
FIGS. 11–20 depict the formation of a damascene gate in accordance with embodiments of the present invention.
Figure 12:
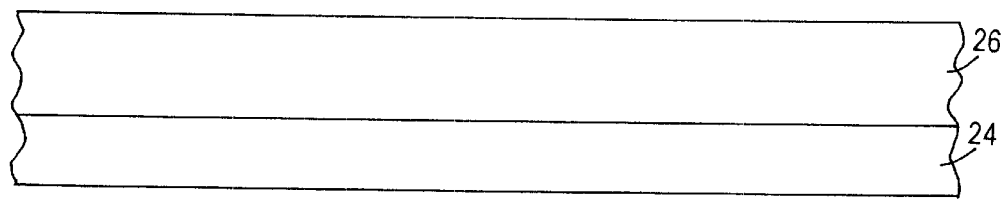
Figure 13:
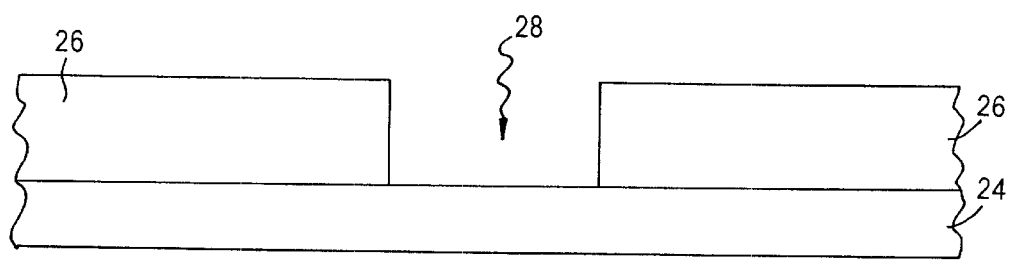
Figure 14:
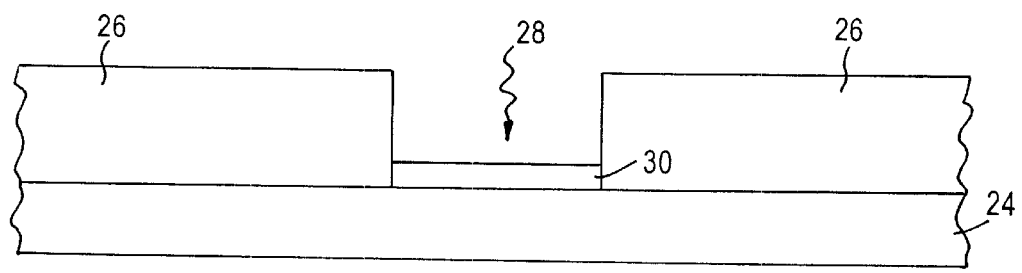
Figure 15:
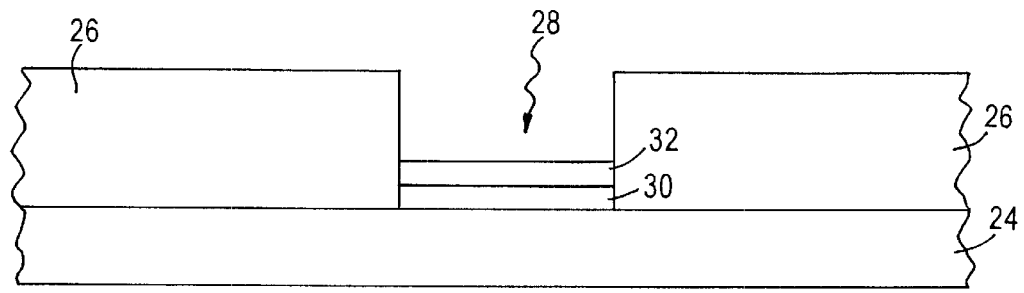

FIG. 11 shows an exemplary semiconductor substrate with a gate 29 and spacers 27 formed thereon. The semiconductor substrate 24 may be N$^+$ doped to form source/drain regions 25. FIG. 12, shows an insulating layer 26 deposited on the semiconductor substrate 24 and around the spacers 27. FIG. 13 is the semiconductor structure of FIG. 12 with an opening 28 etched in the gate 29 down to the semiconductor substrate 24. The opening 28 can define the semiconductor structure and is the characteristic that makes the semiconductor structure a damascene semiconductor structure. 25 FIG. 14 shows a dielectric layer 30 deposited on semiconductor substrate 24 in the opening 28. This dielectric layer 30 forms a gate dielectric. A gate dielectric is a fundamental component of a MOSFET. The dielectric layer 30 may comprise a high k dielectric, an oxide material, or any other material well known in the art that can be used as a gate dielectric. FIG. 15 shows a semiconductor layer 32 deposited on the dielectric layer 30 and in the opening 28. Semiconductor layer 32 maybe 30 between about 200 Å to about 500 Å thick. In certain embodiments, the semiconductor layer 32 is tailored such that the work functions of the gate and the work function of the semiconductor substrate are substantially equal, as required for an ideal MOSFET. Semiconductor layer 32 can be tailored by doping the material comprising semiconductor layer 32 such that the work function of layer 32 is substantially the same as the work function of the semiconductor substrate 24. In certain 35 embodiments, semiconductor layer 32 is polycrystalline silicon.

Figure 16:
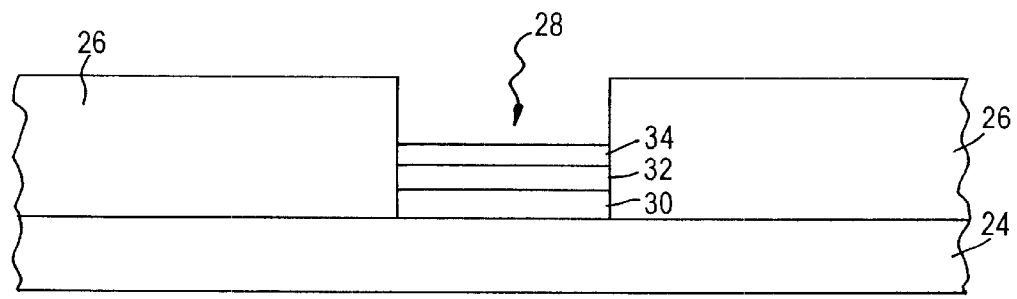

In, FIG. 16, a silicide stop layer 34 has been deposited on semiconductor layer 32 and in the opening 28. The silicide stop layer 34 may be comprised of $SiN_x$, $TiN_x$, $WN_x$, $WC_x$, or $CrN_x$, and may be deposited by CVD, PVD, or other known techniques. In the above mentioned materials, subscript "x" represents all stoichometric variations of the listed materials. Other materials may be used for the silicon stop layer 34 that are conductive and act as a diffusion barrier to prevent diffusion of metal during silicidation. The silicide stop layer 34 may be between about 10 Å to about 200 Å thick in certain embodiments.

Figure 17:
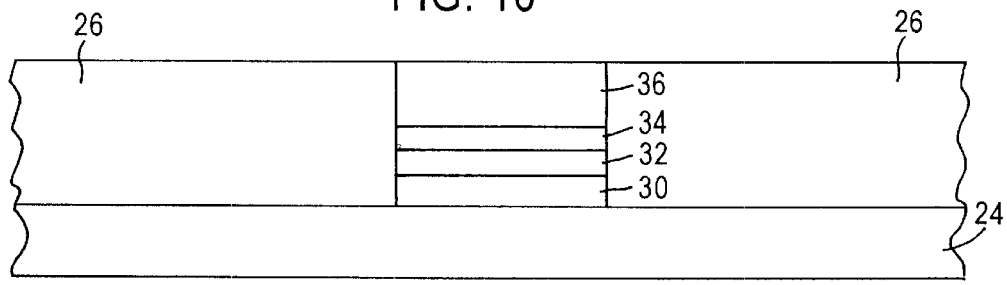
Figure 18:
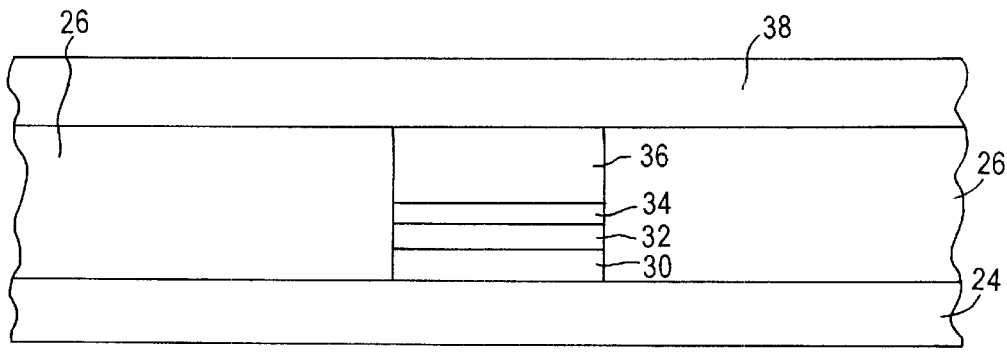

Semiconductor layer 36 is then deposited over silicide stop layer 34, as depicted in FIG. 17. The semiconductor layer 36, in certain embodiments, comprises polycrystalline silicon. In FIG. 18, a metal layer or alloy layer 38 is deposited over insulating layer 26 and semiconductor layer 36. The metal layer or alloy layer 38 may comprise nickel metal or nickel alloy, titanium metal or titanium alloy, cobalt metal or cobalt alloy, or other metals or alloys well known in the art that react with semiconductor materials to form silicides.

Figure 19:
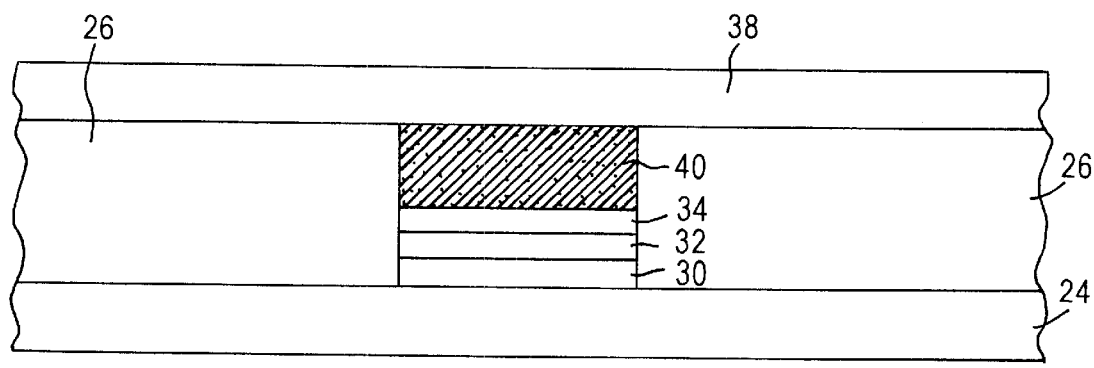

FIG. 19 shows the semiconductor structure of FIG. 18 after an appropriate temperature treatment or treatments, such as rapid thermal annealing steps. This causes the metal layer 38 to react with the semiconductor layer 36 to form silicide. The temperature selected and the number of rapid thermal anneal steps employed is dependent on the type of metal used to form the silicide. For example, when using titanium or cobalt, two rapid thermal annealing steps are typically used to form the lowest resistivity phase silicides. When nickel is used, a single, lower temperature rapid thermal annealing is normally employed to obtain the lowest resistivity phase silicide. When nickel is the metal, for example, annealing may be performed between the temperatures of about 250° C. and about 750° C. to react the metal layer or alloy layer 38 with semiconductor layer 36 to form a nickel silicide layer 40 above the silicide stop layer 34.

Figure 20:
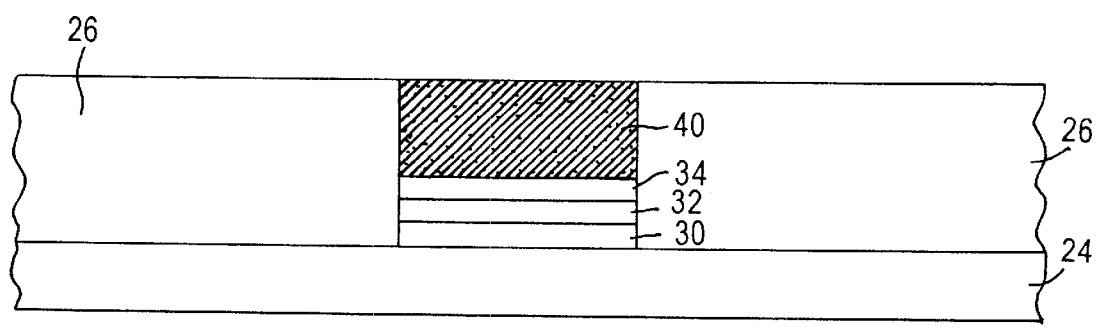

FIG. 20 shows the semiconductor structure of FIG. 19 after the removal of the unreacted metal from metal layer 38 using conventional stripping techniques. Such conventional stripping techniques include use of sulfuric peroxide, hydrochloric acid, nitric acid, phosphoric acid, or mixtures of these stripping agents. The semiconductor structure shown in FIG. 20 is an exemplary embodiment that demonstrates an aspect of a MOSFET.

One of ordinary skill in the art would recognized that the illustrations of the deposition of dielectric layer 30, semiconductor layer 32, silicide stop layer 34, and semiconductor layer 36 in FIGS. 14–17 are ideal and simplified for the purpose of clearly disclosing the invention. It would be apparent to one of ordinary skill in the art that during the deposition of dielectric layer 30, semiconductor layer 32, silicide stop layer 34, and semiconductor layer 36 it is unavoidable that some of this material deposited will attach to spacers 27 and over insulating layer 26. Further, it would be obvious to one of ordinary skill in the art to selectively use a chemical vapor disposition (CVD) or a physical vapor deposition (PVD) technique to minimize material attached to the spacers 27 in order to obtain a structure that most closely resembles that depicted in FIG. 17. Further, one of ordinary skill in the art would realized that prior to achieving a semiconductor structures that resembles that depicted in FIG. 17, excess material deposited over insulating layer 26 would be removed to achieve a semiconductor structure that illustrated in FIG. 17.

The final product of the present invention is a damascene gate arrangement with unique advantages. In summary, the present invention is a damascene gate with a gate dielectric over a silicon substrate with a polysilicon crystalline layer on the gate dielectric. The polycrystalline silicon layer can be engineered to have the most compatible work function with the silicon substrate to prevent an effective bias voltage. By preventing such a bias voltage, the semiconductor device of the present invention can operate more effectively and efficiently. The silicide stop layer, which is formed over the polycrystalline silicon layer, protects the engineered polycrystalline silicon layer from being silicidized during the silicidation of semiconductor material formed over the silicide stop layer. In summary, the present invention offers the advantages of an effective damascene gate semiconductor device with the advantages of a silicide region formed on the gate. One such advantage is a silicide region with a relatively low sheet resistance.

The use of a silicide stop layer as provided in the present invention allows a silicidation process to occur within a damascene gate arrangement, without risking the altering of the work function. The silicide stop layer prevents complete silicidation of the gate electrode, preserving the silicon on the gate dielectric. This enables the effective engineering of the work function of the gate and the semiconductor substrate.

Although the present invention has been described and illustrated in detail, it is to be clearly understood that the same is by way of illustration and example only and is not to be taken by way of limitation, the spirit and scope of the present invention being limited only by the terms of the pending claims.

What is claimed is:

1. A method of forming a damascene semiconductor structure, comprising the steps of:

providing a gate opening in an insulating layer on a substrate;

depositing a first silicon layer in the gate opening over the substrate;

depositing a silicide stop layer in the gate opening over the first silicon layer;

depositing a second silicon layer in the gate opening over the silicide stop layer;

depositing a metal or alloy layer over the insulating layer and the second silicon layer;

temperature treating the damascene semiconductor structure to react the metal or alloy layer with the second silicon layer to form a silicide layer; and removing unreacted metal or alloy in the metal or alloy layer, the silicide stop layer preventing interaction of the first silicon layer with the metal or alloy layer.

2. The method of claim 1, wherein the temperature treating is conducted between about 250° C. and about 750° C.

3. The method of claim 1, wherein the silicide stop layer is about 10 Å to about 200 Å thick.

4. The method of claim 1, wherein the silicide stop layer is conductive and comprises material that is a diffusion barrier during silicidation of the second silicon layer.

5. The method of claim 1, wherein the silicide stop layer is comprised of one of $SiN_x$, $TiN_x$, $WN_x$, $WC_x$, and $CrN_x$, where x represents all stoichiometric variations.

6. The method of claim 1, wherein the metal layer is comprised of one of Ni, Ti, and Co.

7. The method of claim 1, comprising the further step of depositing a dielectric layer in the gate opening over the substrate before the step of depositing the first silicon layer.

8. The method of claim 7, wherein the dielectric layer is comprised of a high k dielectric material having a k value greater than the k value of silicon oxide.

9. The method of claim 7, wherein the dielectric layer is comprised of an oxide dielectric.

* * * * *